(12) United States Patent
Chang et al.

(10) Patent No.: US 6,458,660 B1
(45) Date of Patent: Oct. 1, 2002

(54) METHOD OF FLASH CELL FORMATION

(75) Inventors: Ping-Yi Chang; Wan-Yi Liu, both of Kaohsiung (TW)

(73) Assignee: Macronix International Co., Ltd. (TW)

( * ) Notice: Subject to any disclaimer, the term of this patent is extended or adjusted under 35 U.S.C. 154(b) by 0 days.

(21) Appl. No.: 09/986,933

(22) Filed: Nov. 13, 2001

(51) Int. Cl.[7] .............................................. H01L 21/336
(52) U.S. Cl. ...................... 438/263; 438/264; 438/594
(58) Field of Search ............................. 438/164, 263–4, 438/424, 443, 211, FOR 203, 594, 563; 148/DIG. 50

(56) References Cited

U.S. PATENT DOCUMENTS 5,696,019 A * 12/1997 Chang ................. 148/DIG. 50
6,037,251 A * 3/2000 Tu et al. ...................... 438/624
6,177,317 B1 * 1/2001 Huang et al. ................ 438/263

* cited by examiner

Primary Examiner—George Fourson
Assistant Examiner—Thanh V Pham

(57) ABSTRACT

A method of forming memory cell having buried diffusion oxide is disclosed. The method comprises the steps of providing a substrate having a tunnel oxide layer and a first conductive layer thereon, forming trenches into said tunnel oxide layer and said first conductive layer to expose said substrate, filling said trenches with a dielectric material to a predetermined thickness, removing a portion of said first conductive layer to form a surface lower than said predetermined thickness; and forming a second conductive layer over said dielectric material and said first conductive layer.

7 Claims, 4 Drawing Sheets

METHOD OF FLASH CELL FORMATION

BACKGROUND OF THE INVENTION

1. Field of the Invention

The present invention relates to a method of memory cell formation, and more particularly to a method of forming a memory cell having buried diffusion oxide.

2. Description of the Related Art

Electrically erasable and programmable read only memory (EEPROM) is currently one the most widely used memory devices applied in personal computers and electronic equipment. A memory cell in a early developed conventional EEPROM comprises a transistor with a floating gate to achieve the operations of writing, erasing, and storing data while electrical shut down. This conventional memory cell typically occupies a large surface area and the data access speed is between 150 sn to 200 sn. A lately developed memory cell having a faster data access speed ranged between 70 sn to 80 sn is known as a flash memory. While storing data, a high voltage of 8V is applied between the drain region and the source region. Meanwhile, the controlling gate is biased with the same high voltage. The hot electrons thus flow out of the source region and toward the drain region. While approaching the drain region, these hot electrons tunnel through the oxide layer and are trapped in the floating gate. This is known as the drain side injection operation. By applying a positive voltage to the source region and a negative voltage to the controlling gate, the electrons trapped in the floating gate flow out of the floating gate and tunnel through the oxide layer. Thus the stored data are erased and the floating gate is retrieved to the status before data storing.

FIG. 1A shows a cross-sectional view of a cell region and a periphery region amid a conventional flash cell formation process. A tunnel oxide layer 101, a polysilicon layer 102 and a silicon nitride layer 104 are formed on a silicon substrate 100. Trenches are formed in the polysilicon layer 102 and the silicon nitride layer 104 and filled with a silicon dioxide layer 106. The silicon dioxide layer 106 having the profile shown in FIG. 1A is formed by using a high density plasma (HDP) chemical vapor deposition (CVD) process. FIG. 1B shows a result of etching the silicon dioxide layer 106. The portion of silicon dioxide layer 106 on the cell region is etched to form buried diffusion oxide. FIG. 1C shows a result of forming a photoresist layer 108 over the cell region and removing the portion of silicon dioxide layer 106 on the periphery region. In the following process steps, as shown in FIG. 1D, the photoresist layer 108 and the portion of the silicon nitride layer 104 are sequentially removed, and a polysilicon layer(not shown) is then formed over the substrate 100. The use of the silicon nitride layer 104 of the flash cell formation process set forth renders the flash cell formation process more complicated and time-consuming. Additional photolithography and etching processes are thus necessary and the conventional flash cell formation process mentioned above obviously will not meet the requirements of modern integrated circuit process.

In view of the drawbacks mentioned with the prior art process, there is a continued need to develop new and improved processes that overcome the disadvantages associated with prior art processes. The advantages of this invention are that it solves the problems mentioned above.

SUMMARY OF THE INVENTION

It is therefore an object of the invention to provide a method of forming a memory cell having buried diffusion oxide.

To achieve these objects, and in accordance with the purpose of the invention, the invention uses a method of forming a memory cell having buried diffusion oxide, the method comprises the steps of providing a substrate having a tunnel oxide layer and a first conductive layer thereon, forming trenches into said tunnel oxide layer and said first conductive layer to expose said substrate, filling said trenches with a dielectric material to a predetermined thickness, removing a portion of said first conductive layer to form a surface lower than said predetermined thickness; and forming a second conductive layer over said dielectric material and said first conductive layer.

It is to be understood that both the foregoing general description and the following detailed description are exemplary and explanatory only and are not restrictive of the invention, as claimed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

It is to be understood and appreciated that the process steps and structures described below do not cover a complete process flow. The present invention can be practiced in conjunction with various integrated circuit fabrication techniques that are used in the art, and only so much of the commonly practiced process steps are included herein as are necessary to provide an understanding of the present invention.

The present invention will be described in detail with reference to the accompanying drawings. It should be noted that the drawings are in greatly simplified form and they are not drawn to scale. Moreover, dimensions have been exaggerated in order to provide a clear illustration and understanding of the present invention.

Figure 2A:
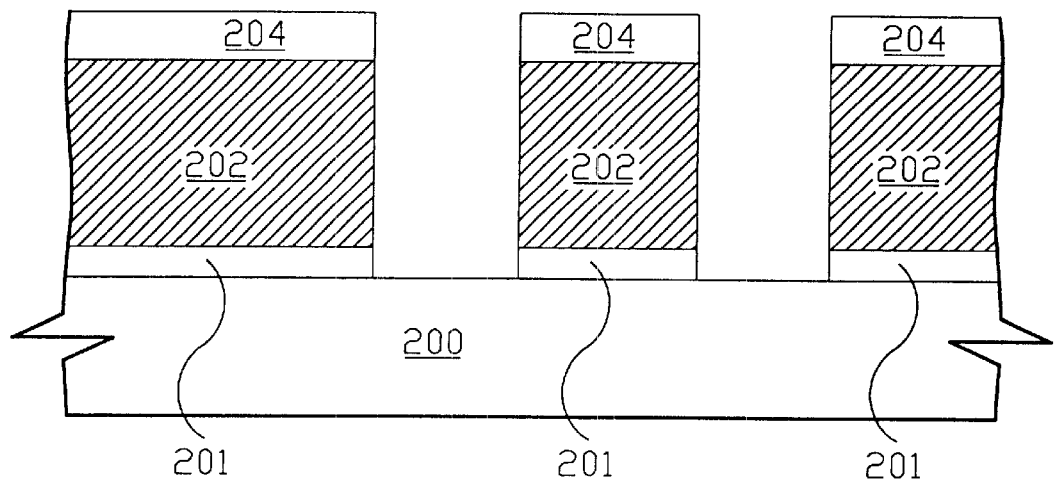
FIG. 2A shows a result of sequentially forming a conductive layer and a DARC layer over a substrate, and forming trenches in the conductive layer to expose the substrate.

Referring to FIG. 2A, a tunnel oxide layer 201, a conductive layer 202 and a dielectric anti-reflective coating (DARC) layer 204 are sequentially formed over a substrate 200, and trenches are formed in the conductive layer 202 to expose the substrate 200. The DARC layer 204 could be omitted. The substrate 200 preferably comprises, but is not limited to: a silicon substrate with a <100> crystallographic orientation. The substrate can also comprise other semiconductor substrate such as a silicon on insulator (SOI) substrate. The conductive layer 202 preferably comprises, but is not limited to: a polysilicon layer formed by a conventional chemical vapor deposition process. Other material met the spirit of this invention should not be excluded. The conductive layer 202 has a thickness larger than about 500 angstrom, and the thickness is preferably about 2200 angstrom. The trenches can be formed by conventional etching and photolithography processes. The etching process is preferably an anisotropically etching process such as a reactive ion etching process. The trenches are used to form buried diffusion oxide in the cell region.

Figure 2B:
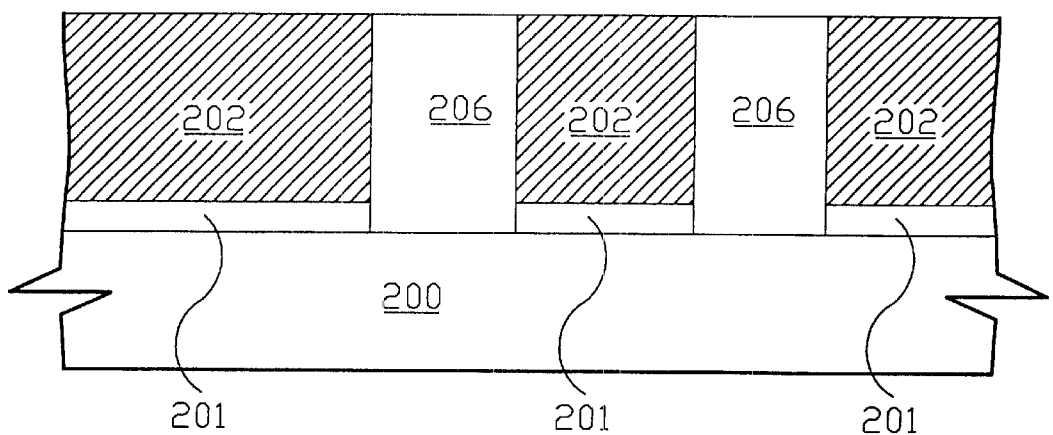
FIG. 2B shows a result of filling the trenches with a dielectric material and removing the DARC layer to form the buried diffusion oxide.

Referring to FIG. 2B, the trenches are filled with a dielectric material 206 to form the buried diffusion oxide. The trenches are filled by the following processes. First, the dielectric material 206 is formed over the substrate 200 by using conventional chemical vapor deposition processes such as a high density plasma chemical vapor deposition (HDPCVD) process. Then the dielectric material 206 is planarized and the DARC layer 204 is removed by a conventional chemical mechanical polishing process to expose the conductive layer 202. The dielectric material 206 comprises, but is not limited to: silicon dioxide.

Figure 2C:
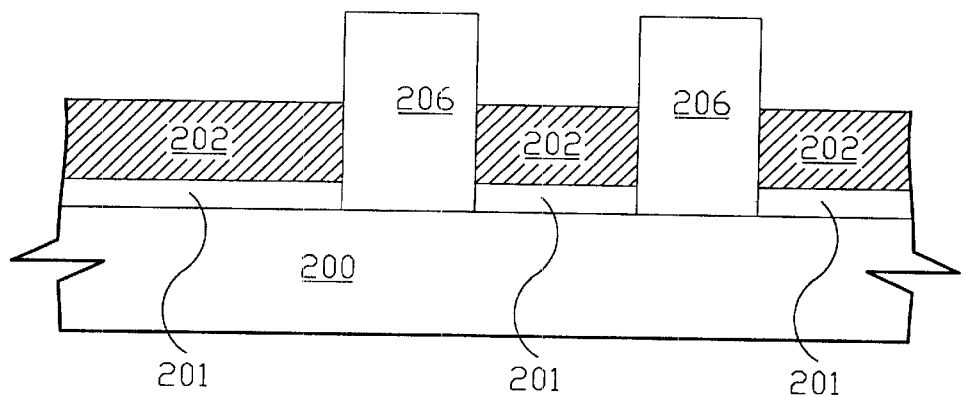
FIG. 2C shows a result of removing a level or a portion of the conductive layer shown in FIG. 2B.
Figure 2D:
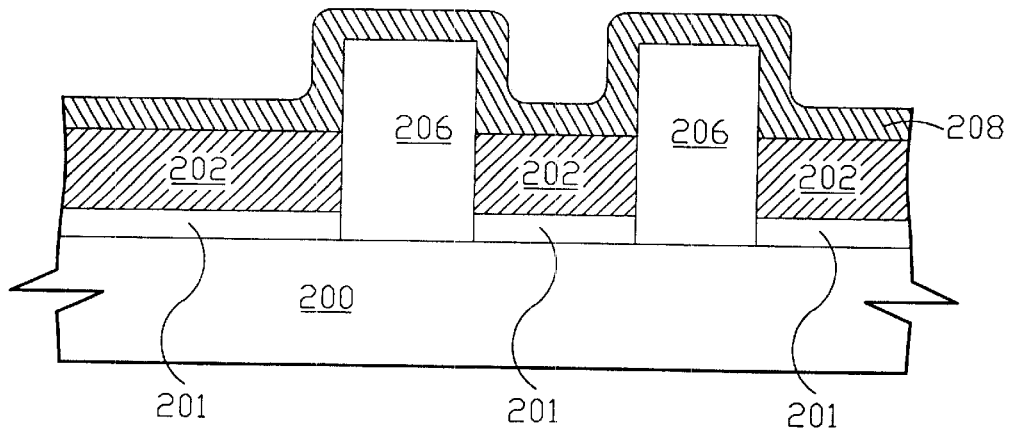
FIG. 2D shows a result of forming a conductive layer over the substrate 200.

Referring to FIG. 2C, a level of the conductive layer 202 is removed by conventional etching processes. The etching processes can be wet etching or dry etching. The thickness of the level is from about 250 angstrom to about 1500 angstrom. The remaining conductive layer 202 preferably has a thickness of about 800 angstrom. Referring to FIG. 2D, a conductive layer 208 is formed over the substrate 200. The conductive layer 208 preferably comprises, but is not limited to: a polysilicon layer formed by a conventional chemical vapor deposition process. The conductive layer 208 is used as floating gates of flash cells and to increase the surface area of the conductive layer 202.

Figure 1A:
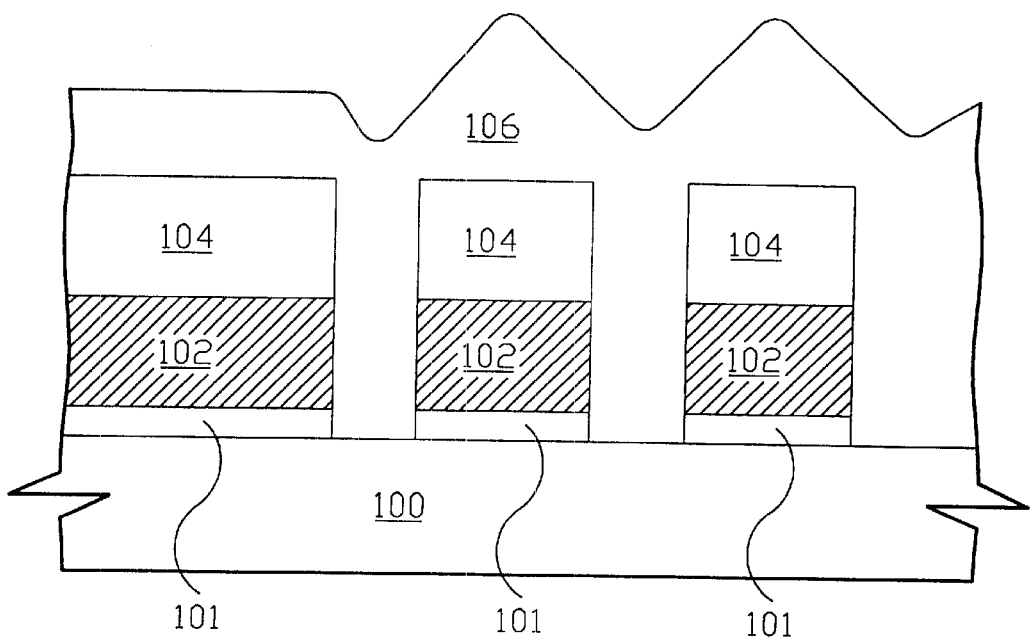
FIG. 1A shows a cross-sectional view of a cell region and a periphery region amid a conventional flash cell formation process.
Figure 1B:
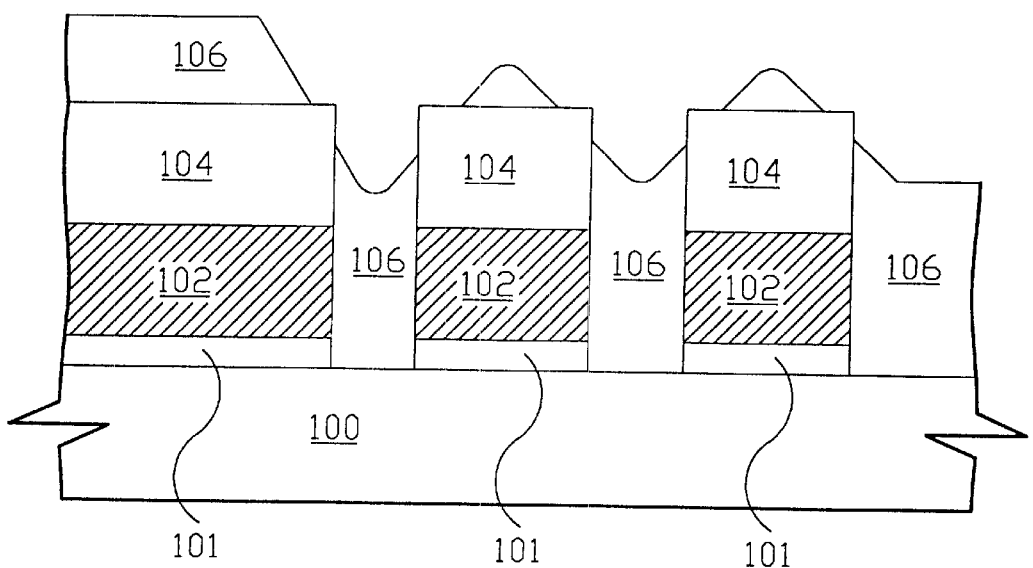
FIG. 1B shows a result of etching the silicon dioxide layer shown in FIG. 1A.
Figure 1C:
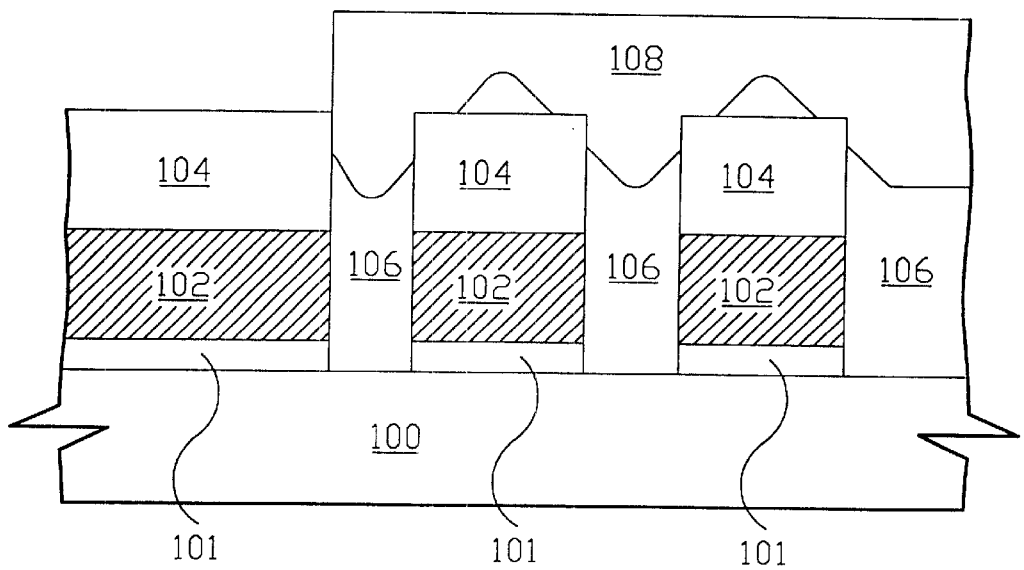
FIG. 1C shows a result of forming a photoresist layer over the cell region and removing the portion of the silicon dioxide layer on the periphery region.
Figure 1D:
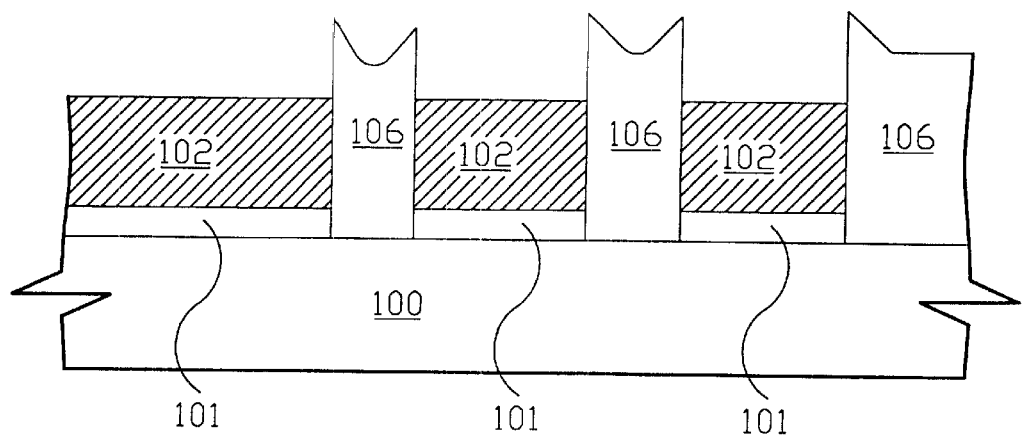
FIG. 1D shows a result of sequentially removing the photoresist layer and the portion of the silicon nitride layer.

Unlike the conventional flash cell formation process, the method uses a recess process to replace the use of silicon nitride in the conventional flash cell formation process to form buried diffusion oxde layer so that less process steps are needed. As shown in FIGS. 1A–1C and described in the related art, the use of silicon nitride in the conventional flash cell formation process needs multiple photolithography and etching processes. In order to form flash cells, two etching processes and a photolithography process are used to sequentially remove the silicon nitride layer 104 on the periphery region and the cell region. Contrarily, the invention achieves the same goal with a simplified process. This is done by a recess process of the conductive layer 202 formed over the periphery region and the cell region and no additional etching and photolithography processes are used.

Other embodiments of the invention will appear to those skilled in the art from consideration of the specification and practice of the invention disclosed herein. It is intended that the specification and examples to be considered as exemplary only, with a true scope and spirit of the invention being indicated by the following claims.

What is claim is:

1. A method of forming a memory cell having buried diffusion oxide, said method comprising:

providing a substrate having a tunnel oxide layer and a first conductive layer thereon;

forming trenches into said tunnel oxide layer and said first conductive layer to expose said substrate;

filling said trenches with a dielectric material to a predetermined thickness to form buried diffusion oxide;

removing a portion of said first conductive layer to form a surface lower than said predetermined thickness; and forming a second conductive layer over said first conductive layer and said dielectric material.

2. The method according to claim 1, wherein the thickness of said first conductive layer is larger than about 500 angstrom.

3. The method according to claim 1, wherein the thickness of said first conductive layer is preferably about 2200 angstrom.

4. The method according to claim 1, wherein said first conductive layer comprises a polysilicon layer.

5. The method according to claim 1, wherein said dielectric material comprises silicon oxide.

6. The method according to claim 1, wherein the thickness of said surface of said first conductive layer is from about 250 angstrom to about 1500 angstrom.

7. The method according to claim 1, wherein said second conductive layer comprises a polysilicon layer.

* * * * *